United States Patent
Wu et al.

(10) Patent No.: US 12,095,020 B2
(45) Date of Patent: Sep. 17, 2024

(54) MICRO-LIGHT-EMITTING DIODE DISPLAY PANEL

(71) Applicant: Prilit Optronics, Inc., Tainan (TW)

(72) Inventors: Biing-Seng Wu, Tainan (TW); Hsin-Hung Chen, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 402 days.

(21) Appl. No.: 17/717,249

(22) Filed: Apr. 11, 2022

(65) Prior Publication Data

US 2023/0327061 A1 Oct. 12, 2023

(51) Int. Cl.
*H01L 29/792* (2006.01)
*H01L 25/18* (2023.01)
*H01L 33/62* (2010.01)

(52) U.S. Cl.
CPC ............. *H01L 33/62* (2013.01); *H01L 25/18* (2013.01)

(58) Field of Classification Search
CPC ... H01L 27/124; H01L 25/0753; H01L 33/62; H01L 22/14; H01L 22/32; H01L 22/34; H01L 2224/18; H01L 23/5254; H01L 23/5258; H01L 23/528; H01L 23/544; H01L 27/156; H01L 33/504; H01L 29/786; H01L 25/167; H01L 23/5386; H01L 25/042; H01L 27/0248; H01L 27/1214; H01L 27/1244; H01L 27/1259; H01L 27/14643; H01L 2224/16225; H01L 2224/2402; H01L 2224/24137; H01L 2224/24227; H01L 2224/32225; H01L 2224/73267; H01L 2224/92244; H01L 23/13; H01L 23/5389; H01L 24/24; H01L 24/82; H01L 25/0655
See application file for complete search history.

(56) References Cited

U.S. PATENT DOCUMENTS

| | | | | |
|---|---|---|---|---|
| 6,111,558 A | * | 8/2000 | Jeung ................. | G02F 1/136259 345/204 |
| 2005/0174316 A1 | * | 8/2005 | Kang ................... | G09G 3/3688 345/100 |
| 2006/0203604 A1 | * | 9/2006 | Park ..................... | G09G 3/3648 365/185.23 |

FOREIGN PATENT DOCUMENTS

TW    I755975 B  * 12/2020  ............. H01L 22/22

* cited by examiner

*Primary Examiner* — Niki H Nguyen
(74) *Attorney, Agent, or Firm* — Donald E. Stout; Stout, Uxa & Buyan, LLP

(57) ABSTRACT

A micro-light-emitting diode (microLED) display panel includes a substrate and a driver bonded on the substrate. The driver includes a signal terminal coupled with a signal wire disposed on the substrate; and a repair terminal associated with the signal terminal, the repair terminal coupled with a repair wire disposed on the substrate.

16 Claims, 3 Drawing Sheets

MICRO-LIGHT-EMITTING DIODE DISPLAY PANEL

BACKGROUND OF THE INVENTION

1. Field of the Invention

The present invention generally relates to a micro-light-emitting diode (microLED) display panel, and more particularly to a microLED display panel capable of being repaired easily.

2. Description of Related Art

A micro-light-emitting diode (microLED, mLED or µLED) display panel is one of flat display panels, and is composed of microscopic microLEDs each having a size of 1-100 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

In the manufacture of the microLED display panel, abnormality (such as open or short circuit) may probably occur while mounting a driver integrated circuit (IC) on a glass substrate. Re-work is then required to repair the abnormality by removing the original driver IC from the glass substrate and then re-mounting a replacement driver IC on the glass substrate, thereby consuming substantial time and cost. Furthermore, it is inevitable that nearby microLEDs may be damaged while re-working the driver IC.

A need has thus arisen to propose a novel scheme for overcoming drawbacks encountered in manufacturing the microLED display panels conventionally.

SUMMARY OF THE INVENTION

In view of the foregoing, it is an object of the embodiment of the present invention to provide a microLED display panel capable of being repaired with substantially reduced time and cost.

According to one embodiment, the microLED display panel includes a substrate and a driver bonded on the substrate. The driver includes a power-signal terminal and a repair terminal associated with the power-signal terminal. The power-signal terminal is connected to a power rail via a power-signal wire disposed on the substrate. The repair terminal is connected to the power rail via a repair wire disposed on the substrate. The power-signal terminal and the associated repair terminal are electrically connected inside the driver.

According to another embodiment, the microLED display panel includes a substrate, and a driver bonded on the substrate. The driver includes a signal terminal and a repair terminal associated with the signal terminal. The signal terminal is coupled with a corresponding signal wire disposed on the substrate. The repair terminal is coupled with a corresponding repair wire disposed on the substrate. The repair wire partially overlaps with, but not initially connects electrically to, the corresponding signal wire.

DETAILED DESCRIPTION OF THE INVENTION

Figure 1:
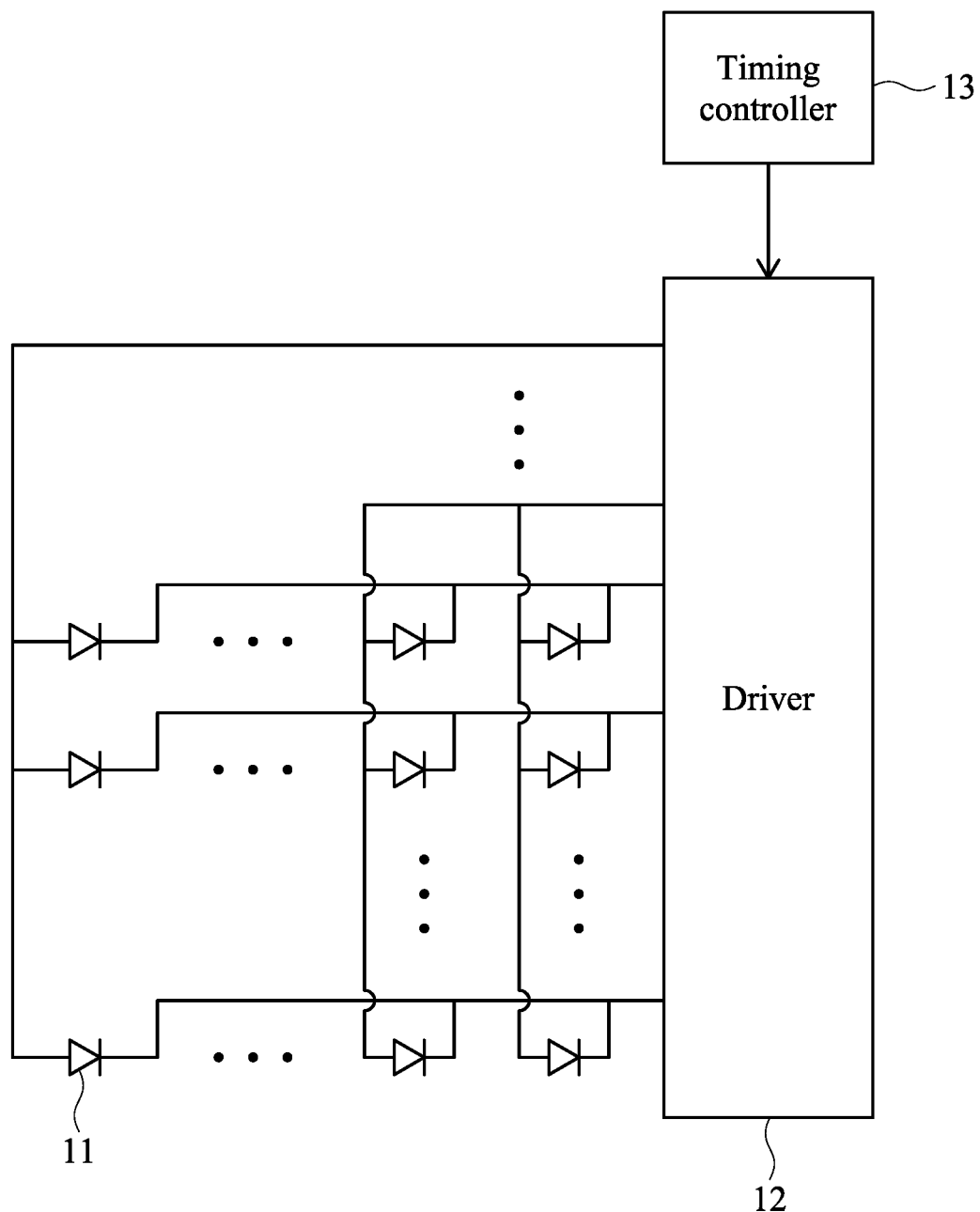
FIG. 1 shows a block diagram illustrating a micro-light-emitting diode (microLED) display panel according to one embodiment of the present invention.

FIG. 1 shows a block diagram illustrating a micro-light-emitting diode (microLED) display panel 100 according to one embodiment of the present invention. In the embodiment, the microLED display panel 100 may include a plurality of microLEDs 11 arranged in a matrix form. The microLED display panel 100 may include a driver 12 (e.g., an integrated circuit) configured to drive the microLEDs 11 by a passive matrix addressing scheme. Specifically, anodes of the microLEDs 11 at the same column are electrically connected to the driver 12, and cathodes of the microLEDs 11 at the same row are electrically connected to the driver 12. The microLED display panel 100 may further include a timing controller 13 configured to control the driver 12.

Figure 2:
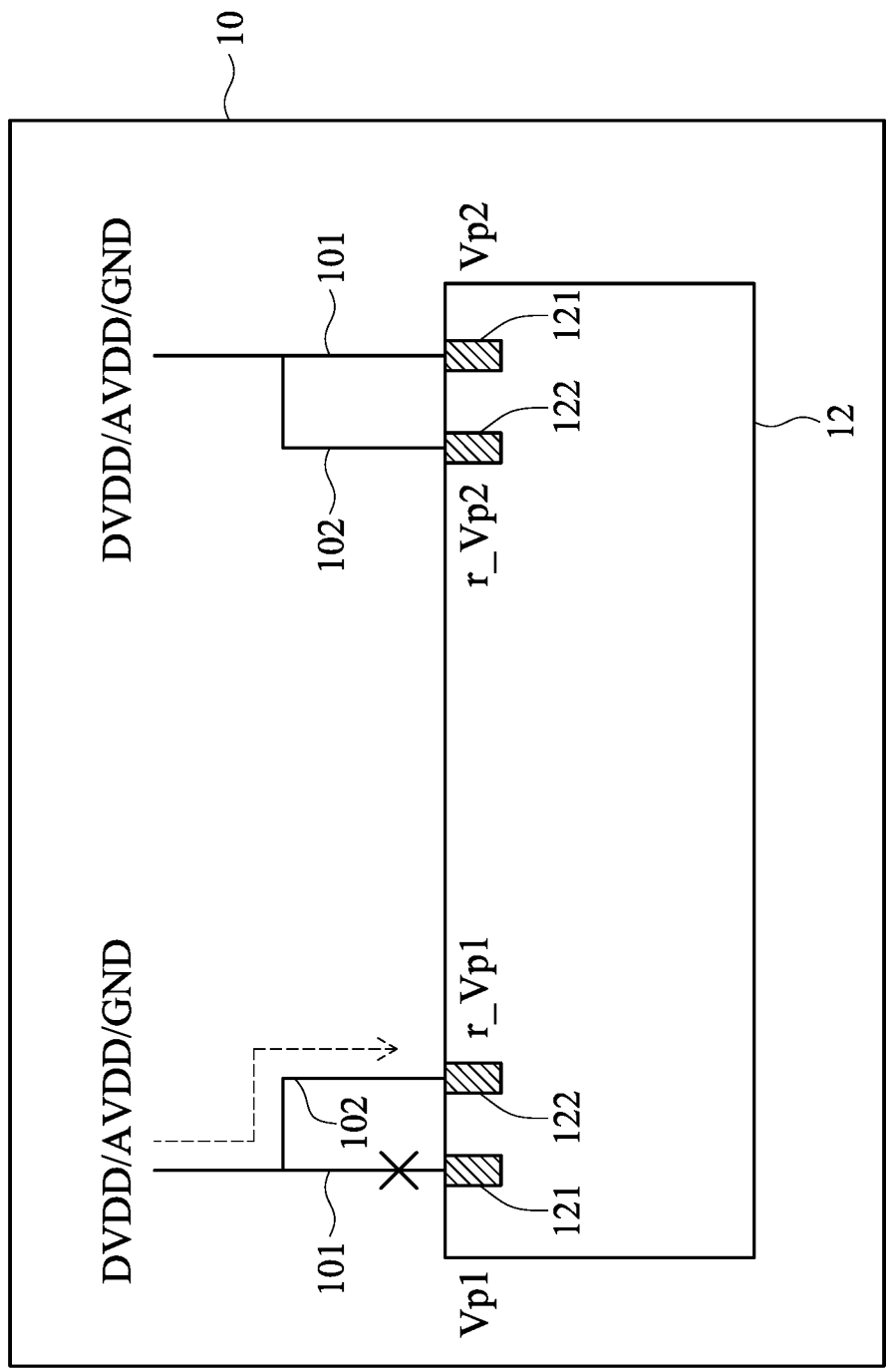
FIG. 2 schematically shows a top view of the microLED display panel according to a first embodiment of the present invention.

FIG. 2 schematically shows a top view of the microLED display panel 100 according to a first embodiment of the present invention. Specifically, the driver 12 is bonded on a substrate 10 (e.g., glass substrate). The driver 12 may include at least one power-signal terminal 121 (or pin or pad) such as Vp1 and Vp2 as exemplified in FIG. 2. The power-signal terminal 121 and other terminals that will be mentioned later in the specification may be made of a conducting material such as indium tin oxide (ITO). The power-signal terminal 121 may be connected to a power rail, such as digital power voltage (DVDD), analog power voltage (AVDD) or ground (GND), via a power-signal wire 101 disposed on the substrate 10.

According to one aspect of the embodiment, the driver 12 of the embodiment may include at least one repair terminal 122 (or pin or pad) such as r_Vp1 and r_Vp2 as exemplified in FIG. 2 associated with the power-signal terminal 121. The repair terminal 122 may be connected to the power rail via a repair wire 102 disposed on the substrate 10. It is noted that the power-signal terminal 121 and the associated repair terminal 122 are electrically connected inside the driver 12.

According to the embodiment as disclosed above, in case that an abnormality (e.g., open or short circuit) is detected on the power-signal terminal 121 (for example, Vp1), connection between the power-signal wire 101 and the power-signal terminal 121 may be severed (or cut), for example, at a location denoted by X. The severance may be performed, for example, by laser cutting. As a result, the repair terminal 122 can be connected to the power rail via the repair wire 102, as denoted by the dashed line, instead of connecting the abnormal power-signal terminal 121 via the power-signal wire 101. Accordingly, the abnormality can be repaired without re-working the driver 12 (i.e., removing the original driver 12 from the substrate 10 and then re-bonding a replacement driver on the substrate 10). Therefore, time and cost may be substantially reduced for manufacturing the microLED display panel 100.

Figure 3:
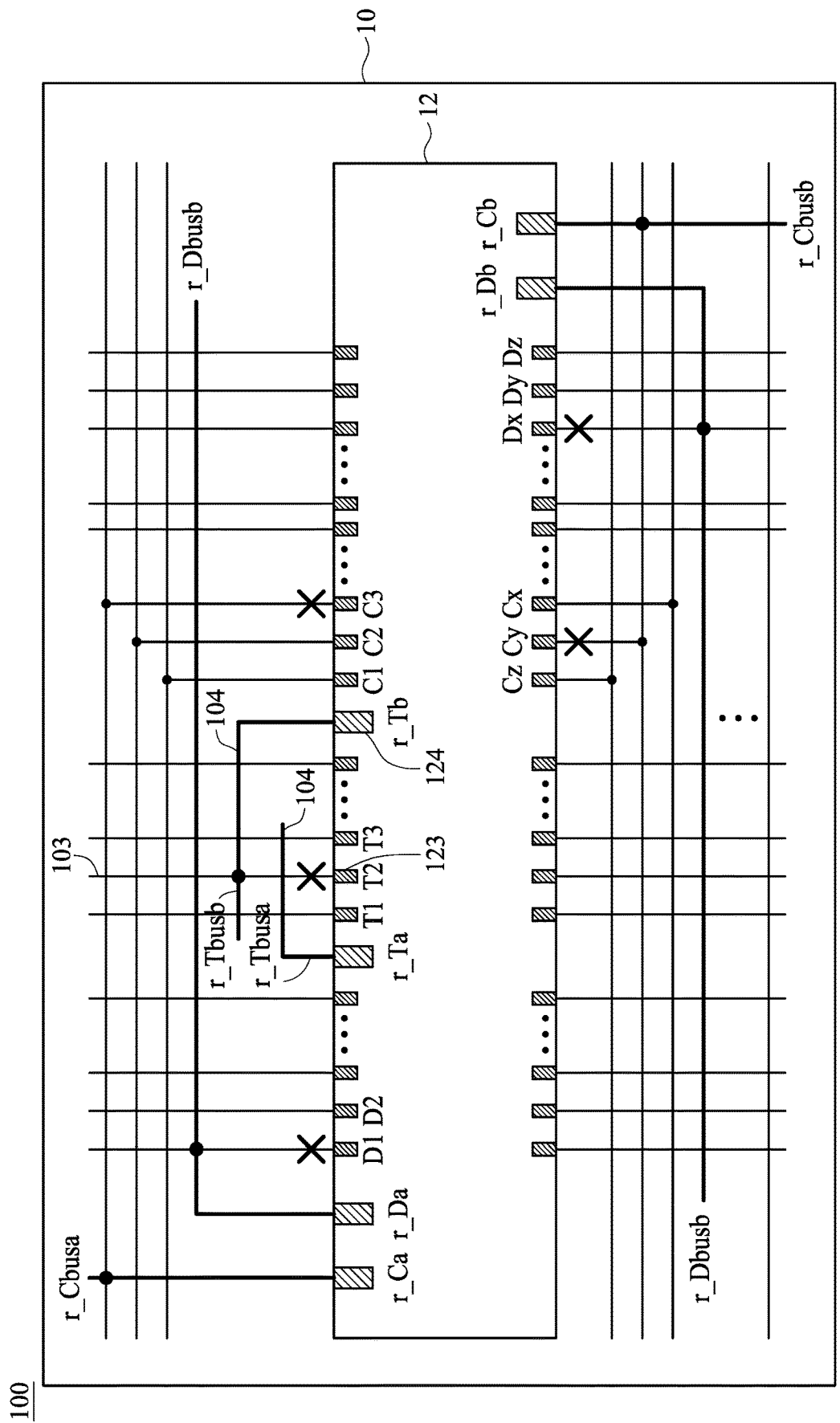
FIG. 3 schematically shows a top view of the microLED display panel according to a second embodiment of the present invention.

FIG. 3 schematically shows a top view of the microLED display panel 100 according to a second embodiment of the present invention. Specifically, the driver 12 is bonded on the substrate 10. The driver 12 may include at least one signal terminal 123 (or pin or pad) such as data and control input signal terminals T1-T3, data output signal terminals D1-D3/Dx-Dz and common output signal terminals C1-C3/

Cx-Cz as exemplified in FIG. 3. The signal terminal 123 may be coupled with a corresponding signal wire 103 disposed on the substrate 10.

According to one aspect of the embodiment, the driver 12 of the embodiment may include at least one repair terminal 124 (or pin or pad) associated with the signal terminal 123. As exemplified in FIG. 3, repair terminals r_Ta and r_Tb are associated with the data and control input signal terminals T1-T3, repair terminals r_Da and r_Db are associated with the data output signal terminals D1-D3/Dx-Dz, and repair terminals r_Ca and r_Cb are associated with the common output signal terminals C1-C3/Cx-Cz. In the embodiment, the repair terminal 124 may be coupled with a corresponding repair wire 104 disposed on the substrate 10. As exemplified in FIG. 3, the repair terminals r_Ta and r_Tb are coupled with corresponding repair wires r_Tbusa and r_Tbusb respectively, the repair terminals r_Da and r_Db are coupled with corresponding repair wires r_Dbusa and r_Dbusb respectively, and the repair terminals r_Ca and r_Cb are coupled with corresponding repair wires r_Cbusa and r_Cbusb respectively.

It is noted that the repair wire 104 may partially overlaps with (or crosses), but not initially connects electrically to, the corresponding signal wires 103. As exemplified in FIG. 3, the repair wires r_Tbusa and r_Tbusb partially overlap with, but not initially connect electrically to, the corresponding signal wires 103 (associated with the signal terminals T1-T3); the repair wires r_Dbusa and r_Dbusb partially overlap with, but not initially connect electrically to, the corresponding signal wires 103 (associated with the signal terminals D1-D3/Dx-Dz); and the repair wires r_Cbusa and r_Cbusb partially overlap with, but not initially connect electrically to, the corresponding signal wires 103 (associated with the signal terminals C1-C3/Cx-Cz).

According to the embodiment as disclosed above, in case that an abnormality (e.g., open or short circuit) is detected on the signal terminal 123 (for example, T2), connection between the signal terminal 123 and the corresponding signal wire 103 may be severed (or cut), for example, at a location denoted by X. The severance may be performed, for example, by laser cutting. Subsequently, an overlapped (or crossing) location (denoted by black dot) between the repair wire 104 (for example, r_Tbusb) and the signal wire 103 (associated with the abnormality) may be electrically coupled, for example, by laser soldering. Next, the repair terminal 124 (for example, r_Tb) is selected and the signal terminal 123 (for example, T2) associated with the abnormality is de-selected in the driver 12, for example, as dictated by the timing controller 13. The selection and de-selection in the driver 12 may be performed by a multiplexer (not shown) that selects among the signal terminals 123 and the repair terminal 124. As a result, the signal wire 103 (associated with the abnormality) may be connected to the repair terminal (for example, r_Tb), instead of the abnormal signal terminal (for example, T2). Accordingly, the abnormality can be repaired without re-working the driver 12 (i.e., removing the original driver 12 from the substrate 10 and then re-bonding it on the substrate 10). Therefore, time and cost may be substantially reduced for manufacturing the microLED display panel 100. Similarly, in case that an abnormality (e.g., open or short circuit) is detected on other signal terminal 123 (such as D1, C3, Cy or Dx as exemplified in FIG. 3), the same procedure may be followed to repair the abnormality.

Although specific embodiments have been illustrated and described, it will be appreciated by those skilled in the art that various modifications may be made without departing from the scope of the present invention, which is intended to be limited solely by the appended claims.

What is claimed is:

1. A micro-light-emitting diode (microLED) display panel, comprising:
a substrate;
a driver bonded on the substrate, the driver including:
a signal terminal coupled with a signal wire disposed on the substrate; and
a repair terminal associated with the signal terminal, the repair terminal coupled with a repair wire disposed on the substrate.

2. The microLED display panel of claim 1, wherein connection between the signal wire and the signal terminal is severed, in case that an abnormality is detected on the signal terminal.

3. The microLED display panel of claim 1, wherein connection between the signal terminal and the signal wire is severed, and an overlapped location between the repair wire and the signal wire is electrically coupled, in case that an abnormality is detected on the signal terminal.

4. The microLED display panel of claim 1, wherein the signal terminal and the repair terminal are made of a conducting material.

5. A micro-light-emitting diode (microLED) display panel, comprising:
a substrate;
a driver bonded on the substrate, the driver including:
a power-signal terminal connected to a power rail via a power-signal wire disposed on the substrate; and
a repair terminal associated with the power-signal terminal, the repair terminal connected to the power rail via a repair wire disposed on the substrate;
wherein the power-signal terminal and the associated repair terminal are electrically connected inside the driver.

6. The microLED display panel of claim 5, wherein connection between the power-signal wire and the power-signal terminal is severed, in case that an abnormality is detected on the power-signal terminal.

7. The microLED display panel of claim 6, wherein the connection between the power-signal wire and the power-signal terminal is severed by laser cutting.

8. The microLED display panel of claim 5, wherein power rail comprises digital power voltage, analog power voltage or ground.

9. The microLED display panel of claim 5, wherein the power-signal terminal and the repair terminal are made of a conducting material.

10. A micro-light-emitting diode (microLED) display panel, comprising:
a substrate;
a driver bonded on the substrate, the driver including:
a signal terminal coupled with a corresponding signal wire disposed on the substrate; and
a repair terminal associated with the signal terminal, the repair terminal coupled with a corresponding repair wire disposed on the substrate;
wherein the repair wire partially overlaps with, but not initially connects electrically to, the corresponding signal wire.

11. The microLED display panel of claim 10, wherein connection between the signal terminal and the signal wire is severed, and an overlapped location between the repair wire and the signal wire is electrically coupled, in case that an abnormality is detected on the signal terminal.

12. The microLED display panel of claim 11, wherein the connection between the signal terminal and the signal wire is severed by laser cutting.

13. The microLED display panel of claim 11, wherein the overlapped location between the repair wire and the signal wire is electrically coupled by laser soldering.

14. The microLED display panel of claim 11, wherein the repair terminal is selected and the signal terminal associated with the abnormality is de-selected in the driver.

15. The microLED display panel of claim 14, wherein the repair terminal is selected and the signal terminal is de-selected by a multiplexer.

16. The microLED display panel of claim 10, wherein the signal terminal and the repair terminal are made of a conducting material.

* * * * *